United States Patent [19]
Iwanade

[11] Patent Number: 4,868,835
[45] Date of Patent: Sep. 19, 1989

[54] ENERGY MODULATABLE LASER UNIT
[75] Inventor: Hisao Iwanade, Tokyo, Japan
[73] Assignee: Asahi Kogaku Kogyo K.K., Tokyo, Japan
[21] Appl. No.: 223,005
[22] Filed: Jul. 22, 1988
[30] Foreign Application Priority Data
  Jul. 24, 1987 [JP] Japan .................... 62-185187
[51] Int. Cl.⁴ ................... H01S 3/10; H01S 3/08
[52] U.S. Cl. ............................ 372/26; 372/29;
  372/50; 372/99; 372/108; 372/102
[58] Field of Search ............. 372/50, 99, 98, 97,
  372/102, 107, 108, 13, 20, 24, 26, 29
[56] References Cited
  U.S. PATENT DOCUMENTS
  4,115,747 9/1978 Sato et al. .................. 372/13
  4,250,465 2/1981 Leib ........................ 372/99
  4,308,506 12/1981 Ellis ....................... 372/13

Primary Examiner—William L. Sikes
Assistant Examiner—Georgia Y. Epps
Attorney, Agent, or Firm—Sandler & Greenblum

[57] ABSTRACT

A laser unit comprises a plurality of lasers for emitting laser beams. The laser beams are deflected by deflecting means arranged in the respective optical axes of the laser beams emitted by the respective lasers to be united along a single optical axis. The energy of the laser beams is reduced when deflected by the deflecting means. The reduction level is determined based upon the number of deflecting means and/or types of deflecting means disposed along the respective optical axis of the laser beam. Thus an aggregated energy of the laser beam outputted from the unit can be modulated by turning the individual laser beams ON or OFF.

20 Claims, 3 Drawing Sheets

| GRADE \ LD | A | B | C | D | LE |
|---|---|---|---|---|---|
| 0 | x | x | x | x | 0 |
| 1 | o | x | x | x | 1/16 |
| 2 | x | o | x | x | 2/16 |
| 3 | o | o | x | x | 3/16 |
| 4 | x | x | o | x | 4/16 |
| 5 | o | x | o | x | 5/16 |
| 6 | x | o | o | x | 6/16 |
| 7 | o | o | o | x | 7/16 |
| 8 | x | x | x | o | 8/16 |
| 9 | o | x | x | o | 9/16 |
| 10 | x | o | x | o | 10/16 |
| 11 | o | o | x | o | 11/16 |
| 12 | x | x | o | o | 12/16 |
| 13 | o | x | o | o | 13/16 |
| 14 | x | o | o | o | 14/16 |
| 15 | o | o | o | o | 15/16 |

ENERGY MODULATABLE LASER UNIT

BACKGROUND OF THE INVENTION

This invention relates to an energy modulatable laser unit, such as a semiconductor laser unit for use in an image recording device, such as a laser beam printer.

Generally, image recording devices, such as a laser beam printer which electrophotographically prints out character data or image data converted into dot-decomposed electrical signals, is constructed as illustrated in FIG. 3.

In FIG. 3 a laser beam emitted from a laser beam emitter 1 and modulated in accordance with image data is deflected by a polygonal scanner 2, which comprises a rotatable multi-sided mirror. The deflected laser beam scans a charged surface of a photoconductive drum 3 so as to form a coresponding latent image thereon. Toner is then electrostaticallly adhered onto the latent image at a developing station 4, and the resulating toner image is transferred onto a recording sheet 5 at a transferred station 6.

In a laser beam printer as described above, a semiconductor laser is mostly used as the laser beam emitter 1. The semiconductor laser has such characteristics as being easy to modulate the beam, as well as being small in size. Further, the semiconductor laser has recently become available at a low cost due to mass production.

In the laser beam printer employing the semiconductor laser, the semiconductor laser is controlled to be turned ON or OFF only for the formation of dots. In other words, the dots thus formed themselves carry no information regarding distinction in their brightness or darkness. Accordingly, with such dots, half-tones of original images cannot be expressed. There is a method for graded expression by either increasing or decreasing, the number of dots per unit area so as to express half tones with dots of an uniform area. However, with this method, the occurrence of moire fringes (interference fringes) inevitably arises. Thus, expressing delicate half-tones is almost impossible.

Nevertheless, in order to realize expressions of delicate half-tones, which has been regarded as impossible as described above, attempts have been made to produce half-tones such as obtaining multiple level tones by modulating the energy of laser beams to control a distribution density of electrostatic charges of the latent image form on the photoconductive element. With this control, toner density of the developed and therefore transfered image can be differentiated in its tone.

However, regarding the semiconductor laser, as indicated in FIG. 4, a threshold current for generating a laser beam varies depending upon surrounding temperatures. In addition, an individual semiconductor laser has its own property, that is, relationship between an electric current value and an output energy level the differs from one to the other. In view of the aforementioned conditions, it is extremely difficult to definitely control the energy level of laser beams through changes in electric current value.

SUMMARY OF THE INVENTION

It is therefore an object of the present invention to provide a semiconductor laser unit that is capable of stably and easily modulating the energy of a laser as it is emitted therefrom. For the above purpose, according to this invention, there is provided a laser unit, comprising a plurality of lasers for emitting laser beams, and a plurality of deflecting means arranged in respective optical axes of the laser beams emitted by respective semiconductor lasers for deflecting the respective optical axes to unite them into a single axis and for reducing the energy of the laser beams, whereby an aggregated energy of the laser beam outputted from the unit can be modulated by turning the individual laser beam ON or OFF.

DESCRIPTION OF THE EMBODIMENTS

Figures 1, 2:
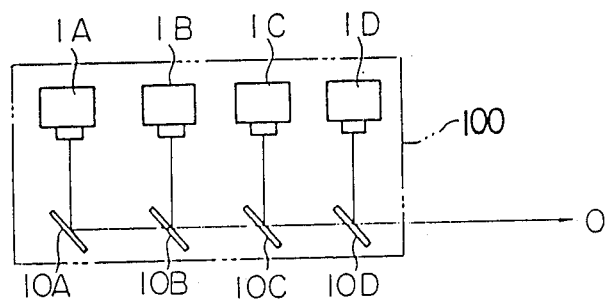
FIG. 1 is a conceptual view of a semiconductor laser unit embodying the invention.
FIG. 2 is a table showing the relationship between drive control for the semiconductor lasers included in the unit illustrated in FIG. 1 and the energy modulation of the laser beam emitted therefrom.

FIG. 1 shows a semiconductor laser unit 100 embodying the invention. Semiconductor laser unit 100 comprises four identical semiconductor lasers 1A, 1B, 1C and 1D and the same number of identical half-mirrors 10 (10A, 10B, 10C and 10D). An energy modulated beam is directed towards O in FIG. 1.

The semiconductor lasers 1A through 1D are arranged side by side in the same plane. In the optical axes of the laser beams emitted from each laser 1A through 1D are the half-mirrors 10A through 10D which are disposed at angles of approximately 45 degrees relative to the respective optical axes. The half mirrors 10A through 10D are also arranged side by side in the same plane. Thus, the respective optical axes are turned at right angles in the same direction. In other words, the unit 100 is structured such that the respective optical axes of the laser beams reflected by the half-mirrors 10A through 10D are united into a single axis that is directed to O. That is, the respective laser beams are cascaded on the optical axis O.

The half-mirrors 10 have a reflection rate of ½ (inversely, a transparency rate of ½), thereby permitting ½ of the laser beam to pass through as well as reflecting the rest ½.

With the unit 100 structed as above, ½ of the laser beam emitted from the laser 1A is reflected by the half-mirror 10A, while the remaining ½ of the laser beam is permitted to pass therethrough. The laser beam reflected by the half-mirror 10A passes sequentially through the half-mirrors 10B, 10C and 10D. Each time the laser beam passes through one of the above half-mirrors, it is reduced by ½, and finally 1/16 of the initial energy.

Similarly, ½ of the laser beam emitted from the laser 1B is reflected by the half-mirror 10B. The laser beam thus reflected passes sequentially through the half-mirrors 10C and 10D, finally amounting to ⅛ of the initial energy. The above analysis can be applied to the laser beam emitted from the lasers 1C and 1D. That is, the laser beams originated from the lasers 1C and 1D finally result in ¼ and ½ of the initial energy, respectively.

If all of the lasers 1A through 1D are simultaneously driven, the total energy amounts to 1/16+⅛+¼+½=15/16 when exiting out of the unit 100. By controlling the lasers 1A through 1D, the energy quantity of the laser beams emitted from the unit 100 can be modulated by the rate of 1/16 as inidicated in FIG. 2. "LE" in the right end column in FIG. 2 represents the ratio of the modulated energy to the whole energy of the laser beams.

Thus, it can be accomplished to modulate the energy of the laser beams by 16 grades, inclusive of zero, where the lasers 1A through 1D are all turned OFF, by driving the lasers in various combinations. In short, the emitted laser beam can be modulated in multiple grades merely by controlling each of the lasers to be turned ON or OFF.

Figure 3:
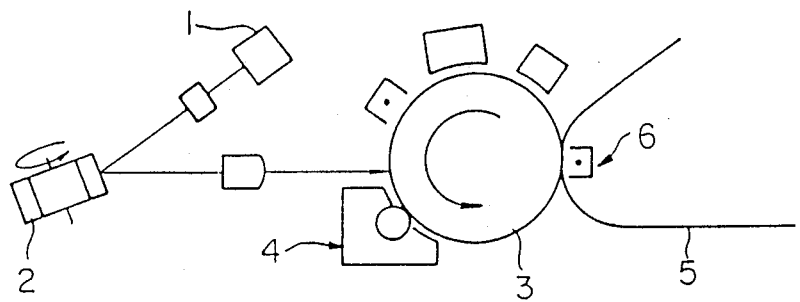
FIG. 3 is a diagramatic structural view of a laser beam printer.
Figure 4:
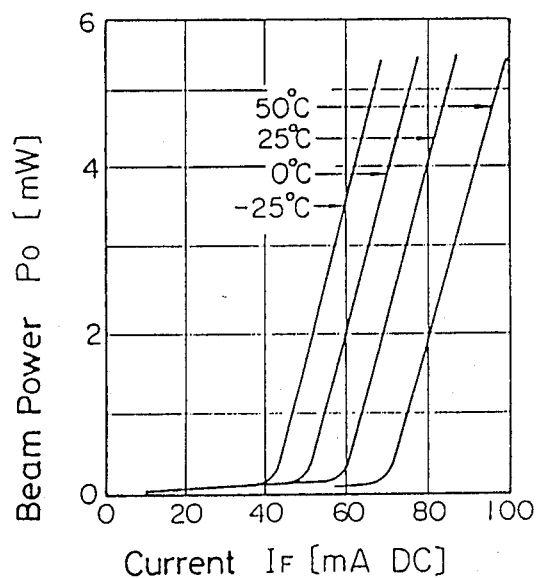
FIG. 4 is a graph showing the temperature dependency of the semiconductor laser outputs.

By applying the above constructed unit 100 as the laser beam emitter 1 to the laser beam printer shown in FIG. 3, without employing a complicated circuit or a special element for energy modulation, distribution density of electrostatic charges of the latent image formed on the photoconductive drum 3 can be differentiated in multiple grades. Thus, half-toned images can be delicately expressed on the recording sheet 5.

Although, in the above embodiment, there are four of lasers, it is understood that the number of lasers to be employed is not restricted to four. The number of lasers shall be determined in accordance with the required modulation grades.

The reflection or transparency rates thereof may of course be subject to proper modification. If the case requires, modulation grades may be set besides geometrical series by differentiating the reflection or transparency rate of respective half mirrors. That is, modulation grades can be set in accordance with the properties of objects to which the laser beams are projected. For example, modulation grades can be so determined as to correct for the nonlinear characteristic residing in the relationship between the quantity of elecotorostatic charges exerted on the photoconductive drum and the energy of the laser beams projected thereonto.

Figure 5:
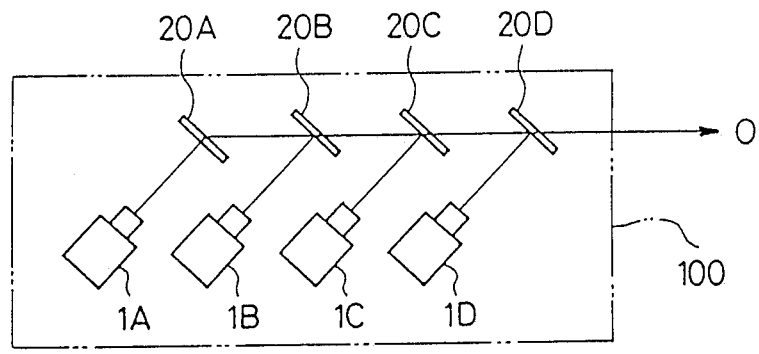
FIG. 5 is a conceptual view of another semiconductor laser unit embodying the invention.

The semiconductor laser unit 100 of FIG. 1 may be modified, as illustrated in FIG. 5. In this modification, the deflecting means of the semiconductor laser unit 100 is provided with as deflecting means four diffraction gratings 20A, 20B, 20C, and 20D in place of the half mirrors 10A, 10B, 10C and 10D of FIG. 1. The laser beam emitted from the semiconductor laser 1A is diffracted by the diffraction gating 20A, and cascadedly diffracted by diffraction gratings 20B, 20C and 20D along the optical axis O.

The positional relationship between the semiconductor laser 1A and the diffraction grating 20A, as well as the relationship between the wavelength of the laser beam emitted from the semiconductor laser 1A and the grating factors of the diffraction grating 20A, are predetermined such that qth-order component of the diffracted beam is directed to the optical axis O.

The qth-order component is then further diffracted by the diffraction grating 20B such that rth-order component of the further diffracted beam is directed to the optical axis O. Subsequently, preliminarily selected ones of the components of the laser beam cascadedly diffracted by the successive diffraction grating 20C and 20D is finally outputted from the unit 100 along the optical axis O.

Similarly, the laser beam emitted from the semiconductor laser 1B is diffracted by the diffraction grating 20B such that qth-order component of the diffracted beam is directed to the optical axis O.

Thus diffracted beam is cascadedly diffracted by the successive diffraction gratings 20C and 20D. The laser beams emitted from the semiconductor lasers 1C and 1D are also cascadedly diffracted by the diffraction grating 20C and/or 20D and outputted from the unit 100 along the optical axis O.

Thus, modulation of the energy of the aggregated laser beam outputted from the unit 100 toward O can be adjusted by the proper selection of the lasers 1A through 1D to be turned ON or OFF, substantially the same as in the embodiment illustrated in FIG. 1.

Figure 6:
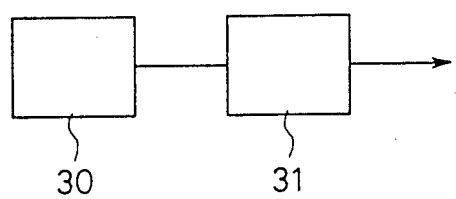
FIG. 6 is a conceptual view of a modified laser emitter.

It should be noted that, although semiconductor lasers are employed in the above embodiments, a gas laser 30, as illustrated in FIG. 6, using an acousto-optic light modulater 31 may instead be employed.

As above described above, with the laser unit of the present invention it is possible to modulate the energy of the laser beams by multiple grades between zero and a maximum without being influenced by surrounding conditions and without employing complicated electrical circuits or special elements thereon. Thus, it is reliable and easy to control.

Having now fully described the invention, it will be apparent to those skilled in the art that many modifications and variations can be made to the invention without departing from the spirit and scope of the invention.

What is claimed is:

1. A semiconductor laser unit, comprising four semiconductor lasers for emitting laser beams, and four half-mirrors, each half-mirror having a reflection rate of ½ arranged in respective optical axes of the laser beams emitted by the respective semiconductor lasers at an angle of 45 degrees in said respective optical axes for deflecting the respective optical axes at substantially right angles to unite them into a single optical axis, whereby an aggregate energy of the laser beam outputted from the semiconductor laser unit can be modulated at the rate of 1/16 by turning the individual semiconductor lasers ON or OFF.

2. A laser unit, comprising:
a plurality of lasers for emitting laser beams; and
a plurality of half-mirrors, each half-mirror having a predetermined reflection rate, said half-mirrors being arranged in respective optical axes, said respective lasers being emitted at a predetermined angle in said respective optical axes for deflecting said respective optical axes at substantially right angles to unite them into a single optical axis, whereby an aggregate energy of said laser beam outputted from said laser unit can be modulated at the rate of $1/R^N$ by turning said individual lasers ON or OFF, where N is equal to the number of said lasers and R is equal to said reflection rate.

3. The laser unit of claim 2, wherein said lasers comprise semiconductor lasers.

4. The laser unit of claim 2, wherein said lasers comprise gas lasers.

5. The laser of claim 3, wherein said predetermined angle of said half- mirrors are approximately 45 degrees.

6. The laser of claim 4, wherein said predetermined angle of said half-mirrors are approximately 45 degrees.

7. The laser unit according to claim 2, wherein said lasers are arranged side by side on a plane for emitting parallel laser beams.

8. A laser unit, comprising:
a plurality of lasers for emitting laser beams; and a plurality of deflecting means having a predetermined reflection rate arranged in respective optical axes of said laser beams emitted by said respective lasers at a predetermined angle in said respective optical axes for deflecting said respective optical axes at substantially right angles to unite them into a single optical axis, whereby an aggregate energy of said laser beam outputted from said laser unit is obtained by turning said individual lasers ON or OFF.

9. The laser unit of claim 8, wherein said lasers comprise semiconductor lasers.

10. The laser unit of claim 8, wherein said lasers comprise gas lasers.

11. The laser unit of claim 8, wherein each deflecting means comprises a half-mirror.

12. The laser unit of claim 11, wherein each half-mirror operates to reflect ½ of said laser beam along said single optical axis.

13. The laser unit of claim 12, wherein said predetermined angle of each half-mirror is approximately 45 degrees.

14. The laser unit of claim 8, wherein said deflecting means comprises a diffraction grating.

15. A laser unit, comprising:
a plurality of lasers arranged side-by-side on the same plane for emitting parallel laser beams; and
a plurality of deflecting means having a predetermined reflection rate arranged in a respective optical axis of said lasers at a predetermined angle to form an aggregate single beam along a single optical axis, whereby the energy of said single beam outputted from said laser unit can be modulated by turning said individual lasers ON or OFF.

16. The laser unit of claim 15, wherein each deflecting means comprises a diffraction grating.

17. The laser unit of claim 16, wherein a diffraction ratio of said diffraction grating in the direction of said single optical axis is 1/R, wherein R represents the amount of said laser beam reflected by said diffraction grating.

18. The laser unit of claim 16, wherein said laser unit can be modulated at the rate of $1/R^N$, wherein R represents the amount of said laser beam that is deflected by said diffraction grating and N is the number of lasers.

19. A laser unit, comprising:
a plurality of lasers arranged side-by-side on a plane for emitting parallel laser beams; and
a plurality of diffraction gratings arranged along respective optical axes at a predetermined angle to form an aggregate single beam along a single optical axis, said diffraction gratings having a diffraction ratio in the direction of said single optical axis of 1/R, the energy of said aggregate single beam outputted by said laser unit being modulated at the rate of $1/R^N$ by turning individual lasers ON or OFF, wherein R is the amount of said laser beam that is reflected by said diffraction grating and N is the number of lasers.

20. The laser unit according to claim 8, wherein said lasers are arranged side by side on a plane for emitting parallel laser beams and wherein said deflecting means comprises a plurality of diffraction gratings arranged in respective optical axes of said lasers at a given angle to form an aggregate single laser beam along a single optical axis.

* * * * *

UNITED STATES PATENT AND TRADEMARK OFFICE
CERTIFICATE OF CORRECTION

PATENT NO. : 4,868,835

DATED : Sep. 19, 1989

INVENTOR(S) : Hisao IWANADE

It is certified that error appears in the above-identified patent and that said Letters Patent is hereby corrected as shown below:

On the title page, item [57]:

In the Abstract, line 10, after "Thus" insert ---,---;

Column 1, line 13, change "coresponding" to ---corresponding---;

Column 1, line 19, change "electrostaticallly" to ---electrostatically---;

Column 1, line 20, change "resulating" to ---resulting---;

Column 1, line 21, change "transterred" to ---transferred---;

Column 1, line 21, change "transferred" to ---transferring--- after "a";

Column 1, line 37, before "the" delete ",";

Column 1, lines 37/38, change "half tones" to ---half-tones---;

Column 1, line 43, change "form" to ---formed---;

Column 1, line 50, change "transfeced" to ---transferred---;

Column 1, line 56, change "the" to ---that--- after "level";

Column 2, line 7, change "beam" to ---beams---;

Column 2, line 17, change "diagramatic" to ---diagrammatic---;

Column 2, line 52, change "structed" to ---structured---;

Column 3, line 6, change "inidicated" to ---indicated---

UNITED STATES PATENT AND TRADEMARK OFFICE
CERTIFICATE OF CORRECTION

PATENT NO. : 4,868,835

DATED : Sep. 19, 1989

INVENTOR(S) : Hisao IWANADE

It is certified that error appears in the above-identified patent and that said Letters Patent is hereby corrected as shown below:

—;

Column 3, line 25, after "four" delete "of";
    Column 3, line 39, change "electorostatic" to —-electrostatic—-;
    Column 3, line 45, delete "as deflecting means";
    Column 3, line 49, change "gating" to —-grating—-;
    Column 3, line 65, change "is" to —-are—-; and
    Column 4, line 13, delete "above" after "As".

Signed and Sealed this

First Day of October, 1991

Attest:

HARRY F. MANBECK, JR.

*Attesting Officer*    *Commissioner of Patents and Trademarks*